(12) United States Patent
Kumar

(10) Patent No.: US 9,813,024 B2
(45) Date of Patent: Nov. 7, 2017

(54) DEPLETED SILICON-ON-INSULATOR CAPACITIVE MOSFET FOR ANALOG MICROCIRCUITS

(71) Applicant: STMicroelectronics International N.V., Amsterdam (NL)

(72) Inventor: Vinod Kumar, Pratapgarh (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 27 days.

(21) Appl. No.: 14/985,759

(22) Filed: Dec. 31, 2015

(65) Prior Publication Data

US 2016/0112011 A1 Apr. 21, 2016

Related U.S. Application Data

(62) Division of application No. 14/219,786, filed on Mar. 19, 2014.

(51) Int. Cl.
*H03F 1/02* (2006.01)
*H01L 29/78* (2006.01)
(Continued)

(52) U.S. Cl.
CPC ............ *H03F 1/0205* (2013.01); *G05F 3/16* (2013.01); *H01L 21/84* (2013.01);
(Continued)

(58) Field of Classification Search
CPC ............ H01L 2924/00; H01L 27/0255; H01L 27/1203
See application file for complete search history.

(56) References Cited

U.S. PATENT DOCUMENTS 5,047,816 A 9/1991 Cuevas
5,099,227 A * 3/1992 Geiszler ............... G06K 7/0008
235/440
(Continued)

OTHER PUBLICATIONS

Yamaoka et al., "SRAM Circuit With Expanded Operating Margin and Reduced Stand-By Leakage Current Using Thin-BOX FD-SOI Transistors," IEEE Journal of Solid-State Circuits, vol. 41, No. 11, Nov. 2006; pp. 2366-2372.

*Primary Examiner* — Allen Parker
*Assistant Examiner* — Ismail Muse
(74) *Attorney, Agent, or Firm* — Seed Intellectual Property Law Group LLP

(57) ABSTRACT

Dual gate FD-SOI transistors are used as MOSFET capacitors to replace passive well capacitors in analog microcircuits. Use of the dual gate FD-SOI devices helps to reduce unstable oscillations and improve circuit performance. A thick buried oxide layer within the substrate of an FD-SOI transistor forms a capacitive dielectric that can sustain high operating voltages in the range of 1.2 V-3.3 V, above the transistor threshold voltage. A secondary gate in the FD-SOI transistor is used to create a channel from the back side so that even when the bias voltage on the first gate is small, the effective capacitance remains higher. The capacitance of the buried oxide layer is further utilized as a decoupling capacitor between supply and ground. In one example, a dual gate PMOS FD-SOI transistor is coupled to an operational amplifier and a high voltage output driver to produce a precision-controlled voltage reference generator. In another example, two dual gate PMOS and one dual gate NMOS FD-SOI transistor are coupled to a charge pump, a phase frequency detector, and a current-controlled oscillator to produce a high-performance phase locked loop circuit in which the decoupling capacitor footprint is smaller, in comparison to the conventional usage of passive well capacitance.

20 Claims, 13 Drawing Sheets

(51) Int. Cl.
  *H01L 29/94*       (2006.01)
  *H01L 29/66*       (2006.01)
  *H01L 21/84*       (2006.01)
  *G05F 3/16*        (2006.01)
  *H03K 17/687*      (2006.01)
  *H03L 7/093*       (2006.01)
  *H03F 3/193*       (2006.01)
  *H01L 29/786*      (2006.01)

(52) U.S. Cl.
  CPC .... *H01L 29/66181* (2013.01); *H01L 29/7831* (2013.01); *H01L 29/78603* (2013.01); *H01L 29/78648* (2013.01); *H01L 29/94* (2013.01); *H03F 3/193* (2013.01); *H03K 17/687* (2013.01); *H03L 7/093* (2013.01); *H03F 2200/451* (2013.01)

(56) References Cited

U.S. PATENT DOCUMENTS

| | | | |
|---|---|---|---|
| 5,977,816 A * | 11/1999 | Lee | H02M 3/073 327/536 |
| 6,130,117 A | 10/2000 | Walker et al. | |
| 6,452,234 B1 * | 9/2002 | Mahanpour | H01L 27/0255 257/349 |
| 6,534,831 B2 * | 3/2003 | Kato | H01L 29/78639 257/347 |
| 6,548,870 B1 | 4/2003 | Lee | |
| 6,954,100 B2 | 10/2005 | Dharne et al. | |
| 6,963,226 B2 | 11/2005 | Chiang | |
| 7,256,456 B2 * | 8/2007 | Ohkubo | H01L 21/743 257/347 |
| 7,385,436 B2 | 6/2008 | Itoh et al. | |
| 2002/0182784 A1 | 12/2002 | Hirashita et al. | |
| 2003/0209761 A1 * | 11/2003 | Yagishita | H01L 21/84 257/347 |
| 2005/0269642 A1 * | 12/2005 | Minami | H01L 27/0255 257/355 |
| 2007/0040584 A1 | 2/2007 | Ngo et al. | |
| 2007/0063758 A1 | 3/2007 | Allard et al. | |
| 2008/0116939 A1 * | 5/2008 | Takizawa | H01L 21/84 326/103 |
| 2009/0261873 A1 | 10/2009 | Lin et al. | |
| 2010/0080270 A1 * | 4/2010 | Chen | H04L 27/0008 375/219 |
| 2010/0264492 A1 | 10/2010 | Surdeanu et al. | |
| 2011/0108908 A1 * | 5/2011 | Lebby | H01L 29/78603 257/327 |
| 2011/0171792 A1 | 7/2011 | Chang et al. | |
| 2012/0187998 A1 | 7/2012 | Jarrar et al. | |
| 2012/0261792 A1 | 10/2012 | Cheng et al. | |
| 2013/0005095 A1 * | 1/2013 | Cai | H01L 27/1203 438/154 |
| 2013/0162358 A1 * | 6/2013 | Xiao | G05F 3/242 331/66 |
| 2013/0277747 A1 | 10/2013 | Liu et al. | |
| 2015/0171749 A1 | 6/2015 | Guo et al. | |

\* cited by examiner

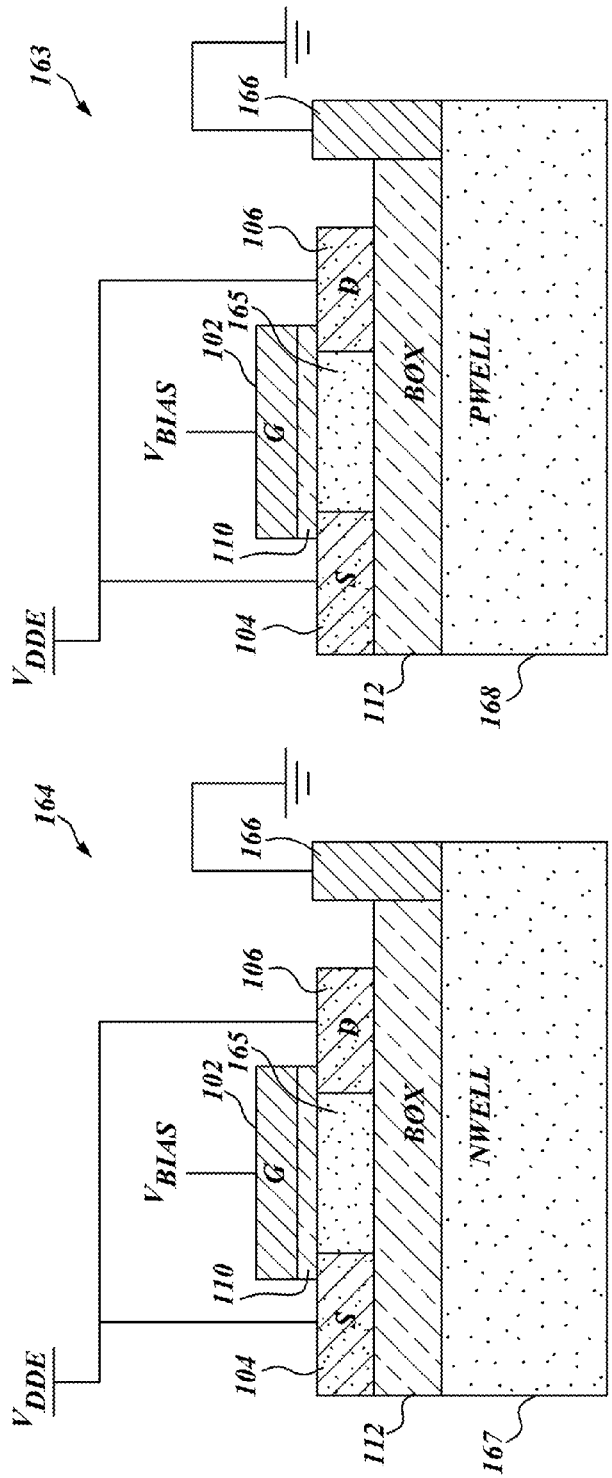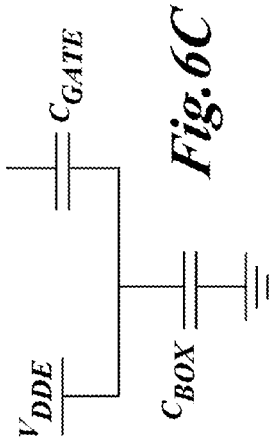
Fig.6A CPMOS1
Fig.6B CPMOS2FW
Fig.6C

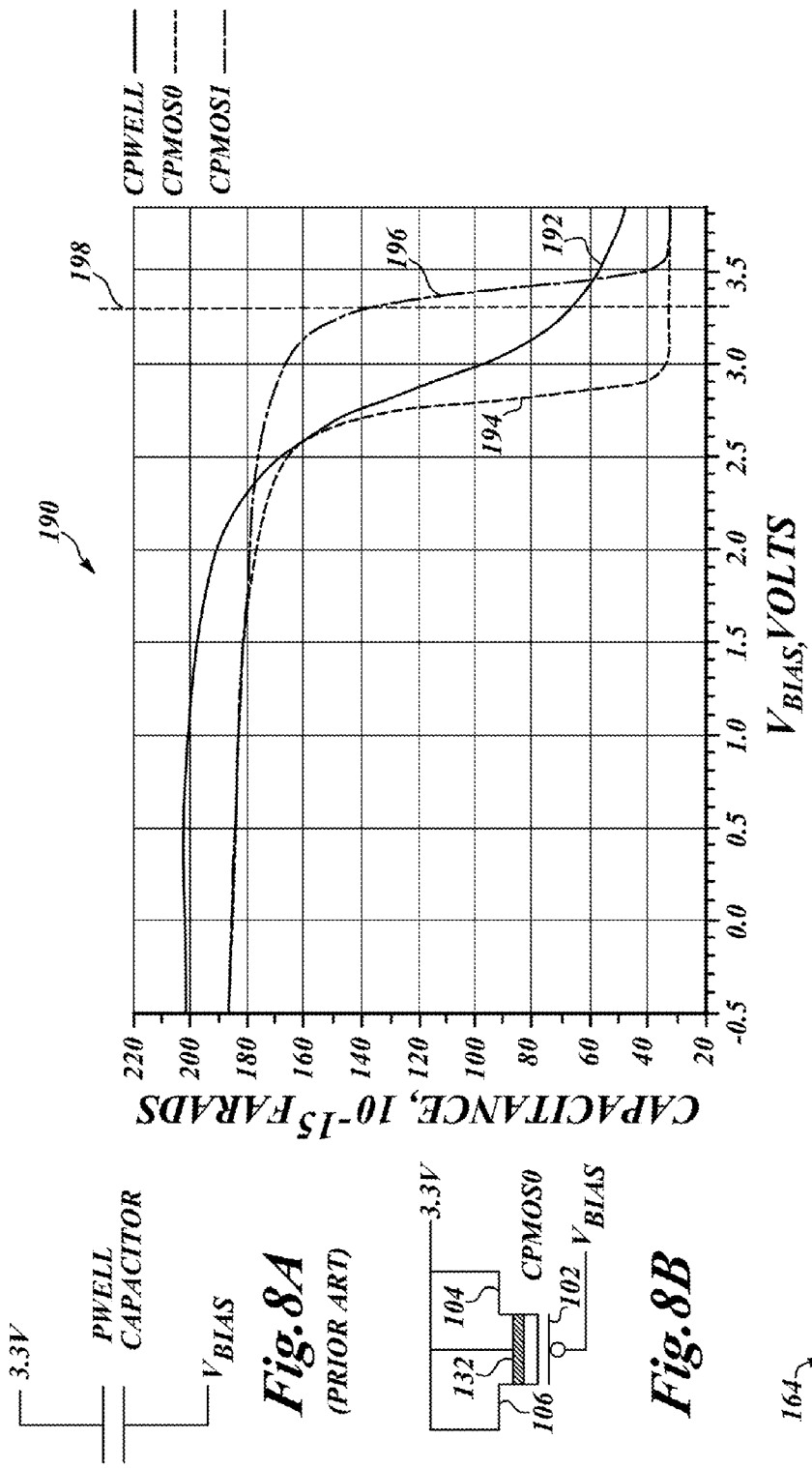

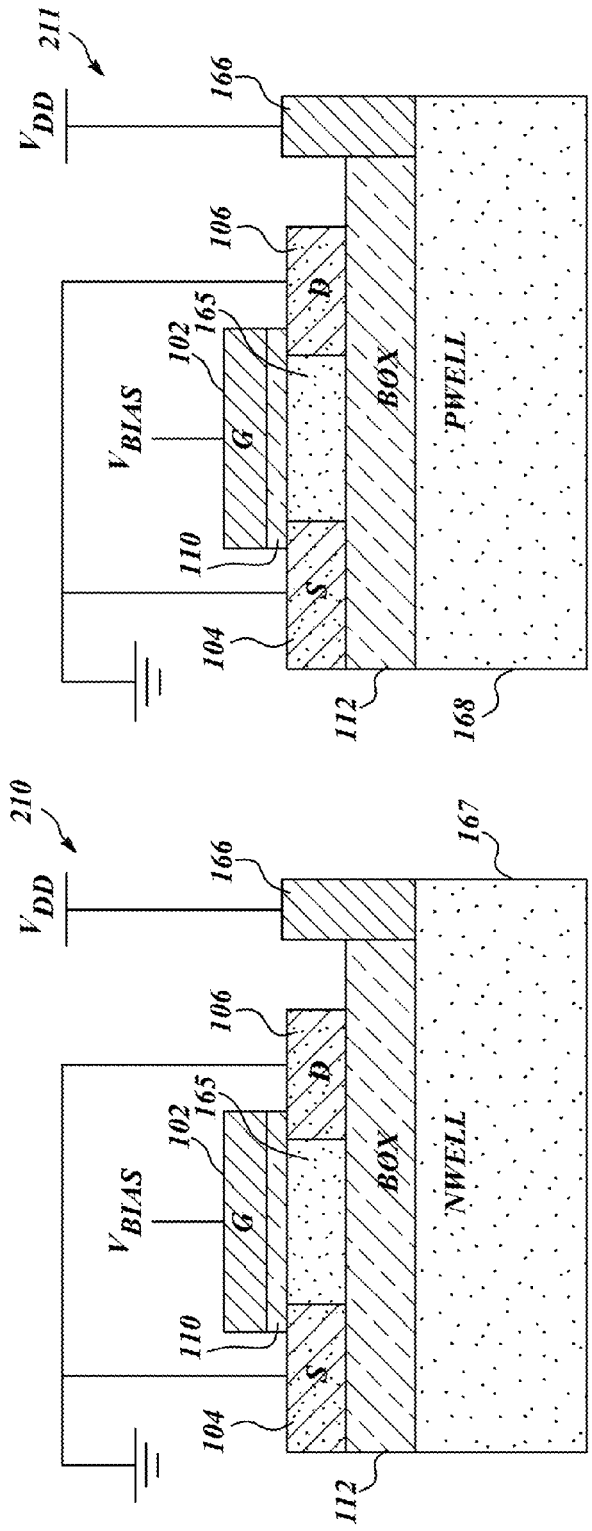
Fig.10A CNMOS2FW
Fig.10B CNMOS1
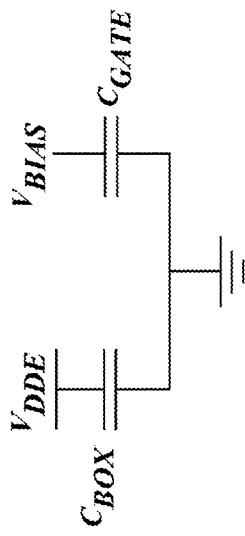
Fig.10C

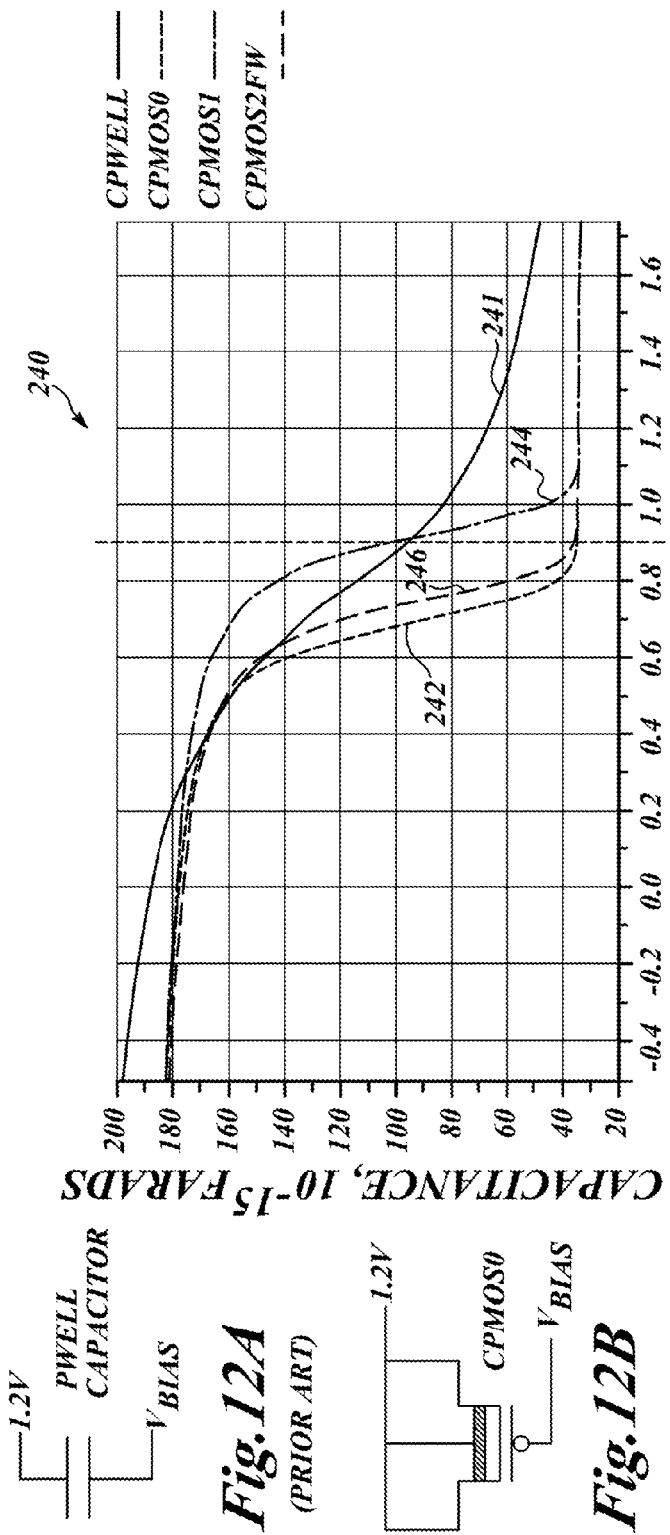
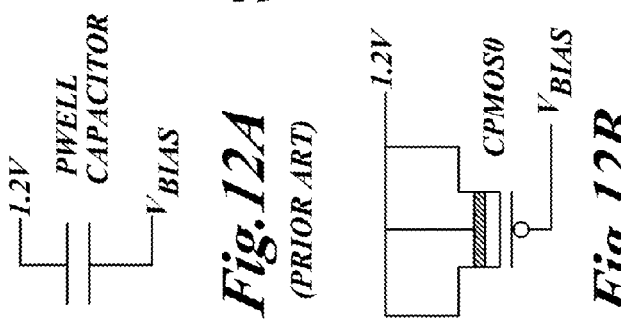
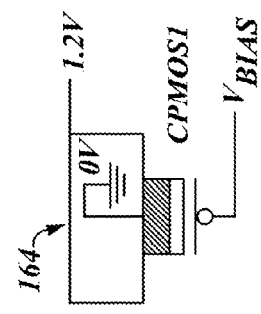
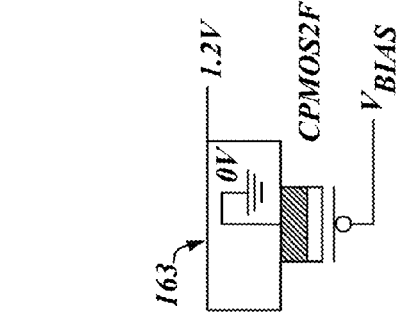
*Fig.12A* (PRIOR ART)   *Fig.12B*   *Fig.12C*   *Fig.12D*   *Fig.12E*

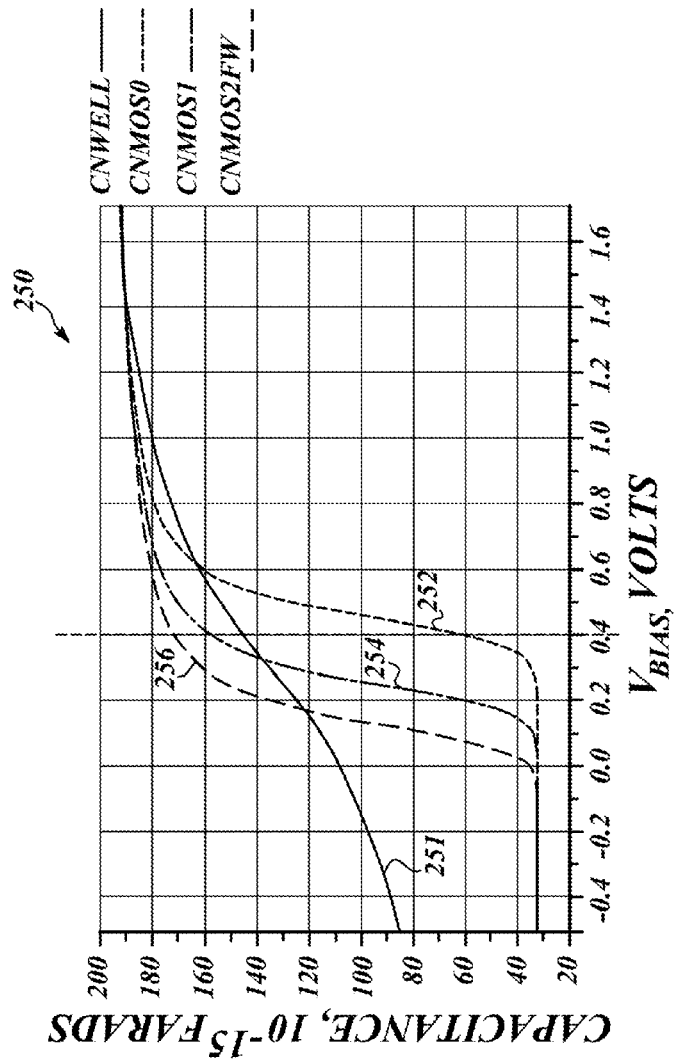
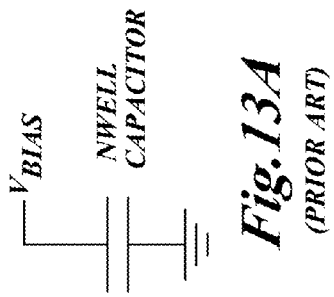
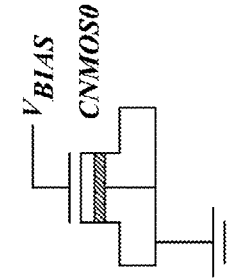
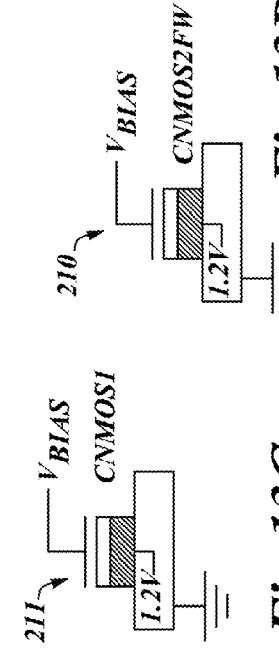
Fig.13A (PRIOR ART)
Fig.13B
Fig.13C
Fig.13D
Fig.13E

DEPLETED SILICON-ON-INSULATOR CAPACITIVE MOSFET FOR ANALOG MICROCIRCUITS

CROSS-REFERENCE TO RELATED APPLICATION

The present patent application is a divisional of U.S. patent application Ser. No. 14/219,786, filed Mar. 19, 2014, which is hereby incorporated by reference in its entirety.

BACKGROUND

Technical Field

The present disclosure generally relates to the use of fully depleted silicon-on-insulator (FD-SOI) transistors as substitutes for passive capacitors, and to applications of such capacitive transistor structures in improving performance of analog microcircuits.

Description of the Related Art

Analog microcircuits and, in particular, integrated analog circuits built on semiconductor substrates, are used widely in medical electronics, aerospace systems, and devices equipped with RF communications capability. Such RF-equipped devices include smart phones, tablet computers, microelectronic sensors, and the like. Specific examples of analog microcircuits include reference voltage generator circuits and phase locked loops. Reference voltage generator circuits are used to produce a constant reference voltage in voltage-regulated devices such as power supplies and analog-to-digital converters. Phase locked loop (PLL) circuits are used to perform phase matching between input and output signals of oscillators. Such circuits can be used, for example, in microprocessors for clock synchronization, and in telecommunications for signal demodulation and frequency synthesis.

Capacitors are frequently used as components in analog microcircuits. Various structures that are present on integrated circuit chips can be made available to circuit designers for use as parallel plate capacitors, or such capacitors can be specially designed. Alternatively, it is possible for metal-oxide-semiconductor field effect transistors (MOSFETs), which are ubiquitous on integrated circuit chips, to be used as capacitors in various microcircuits if the components are connected in a particular manner. In a field effect transistor (FET), a thin gate oxide layer between the gate and the channel can be considered a capacitive dielectric, and the gate and the channel regions can be considered two parallel plates of a capacitor. However, because typical gate oxide layers are only a few nm thick, the gate oxide layer tends to be vulnerable and can break down easily in response to application of a gate voltage that is slightly too large. Furthermore, transistors are active, three-terminal devices whereas capacitors are passive, two-terminal devices that are generally much simpler and less expensive to manufacture. For at least these reasons, it is generally not customary to connect transistors in such a way that they can be used as capacitors.

BRIEF SUMMARY

Dual gate FD-SOI transistors are used as MOSFET capacitors in analog microcircuits to reduce unstable oscillations and to improve circuit performance. A primary gate spaced apart from the channel by a gate dielectric layer controls current in the channel of the device. A secondary gate also controls current in the channel, the secondary gate being spaced apart from the channel by a thicker buried dielectric layer within the substrate of the SOI transistors. The thick buried oxide layer acts as a capacitive dielectric that can sustain high operating voltages in the range of 1.2 V-3.3 V, above the transistor threshold voltage, which is typically about 0.5 V. In one embodiment, the dielectric of the gate and the buried layer are oxides, such as $SiO_2$. Such FD-SOI devices can be substituted for parallel plate capacitor components in integrated circuits, to improve circuit performance and efficiency.

In one exemplary embodiment, a dual gate PMOS FD-SOI transistor is coupled to an operational amplifier and a high voltage output driver to produce a precision-controlled voltage reference generator.

In another exemplary embodiment, two dual gate PMOS transistors and one dual gate NMOS FD-SOI transistor are coupled to a charge pump, a phase frequency detector, and a current-controlled oscillator to produce a high-performance phase locked loop circuit in which the decoupling capacitor footprint is significantly smaller.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 6A is a cross-section of a dual gate PMOS FD-SOI MOSFET device configuration, as described herein.

FIG. 6B is a cross-section of a dual gate flip well PMOS FD-SOI MOSFET device configuration, as described herein.

FIG. 6C is a schematic diagram of the dual gate PMOS FD-SOI MOSFET device configurations shown in FIGS. 6A and 6B.

FIG. 8A is a schematic diagram of a conventional PWELL capacitor operated at a supply voltage of 3.3 V.

FIG. 8B is a schematic diagram of a dual gate PMOS transistor for use as a capacitor in a circuit having a supply voltage of 3.3 V.

FIG. 8C is a schematic diagram of an FD-SOI dual gate PMOS transistor for use as a capacitor in a circuit having a supply voltage of 3.3 V, as described herein.

FIG. 8D is a plot of simulated capacitance vs voltage (C-V) curves for the device configurations shown in FIGS. 8A-8C.

FIG. 10A is a cross-section of a dual gate NMOS FD-SOI MOSFET device configuration, as described herein.

FIG. 10B is a cross-section of a dual gate flip well NMOS FD-SOI MOSFET device configuration, as described herein.

FIG. 10C is a schematic diagram of the dual gate NMOS FD-SOI MOSFET device configurations shown in FIGS. 10A and 10B.

FIG. 12A is a schematic diagram of a conventional NWELL capacitor operated at a supply voltage of 1.2 V.

FIG. 12B is a schematic diagram of a dual gate NMOS transistor for use as a capacitor in a circuit having a supply voltage of 1.2 V.

FIG. 12C is a schematic diagram of an FD-SOI dual gate NMOS transistor for use as a capacitor in a circuit having a supply voltage of 1.2 V, as described herein.

FIG. 12D is a schematic diagram of a flip-well FD-SOI dual gate NMOS transistor CNMOSFW, for use as a capacitor in a circuit having a supply voltage of 1.2 V, as described herein.

FIG. 12E is a plot of simulated C-V curves for the device configurations shown in FIGS. 12A-12D.

FIG. 13A is a schematic diagram of a conventional PWELL capacitor operated with a bias voltage.

FIG. 13B is a schematic diagram of a dual gate PMOS transistor for use as a capacitor in a circuit having an applied bias voltage.

FIG. 13C is a schematic diagram of an FD-SOI dual gate PMOS transistor for use as a capacitor in a circuit having a supply voltage of 1.2 V, as described herein.

FIG. 13D is a schematic diagram of a flip-well FD-SOI dual gate PMOS transistor CNMOSFW, for use as a capacitor in a circuit having a supply voltage of 1.2 V, as described herein.

FIG. 13E is a plot of simulated C-V curves for the device configurations shown in FIGS. 13A-13D.

DETAILED DESCRIPTION

Figure 1:
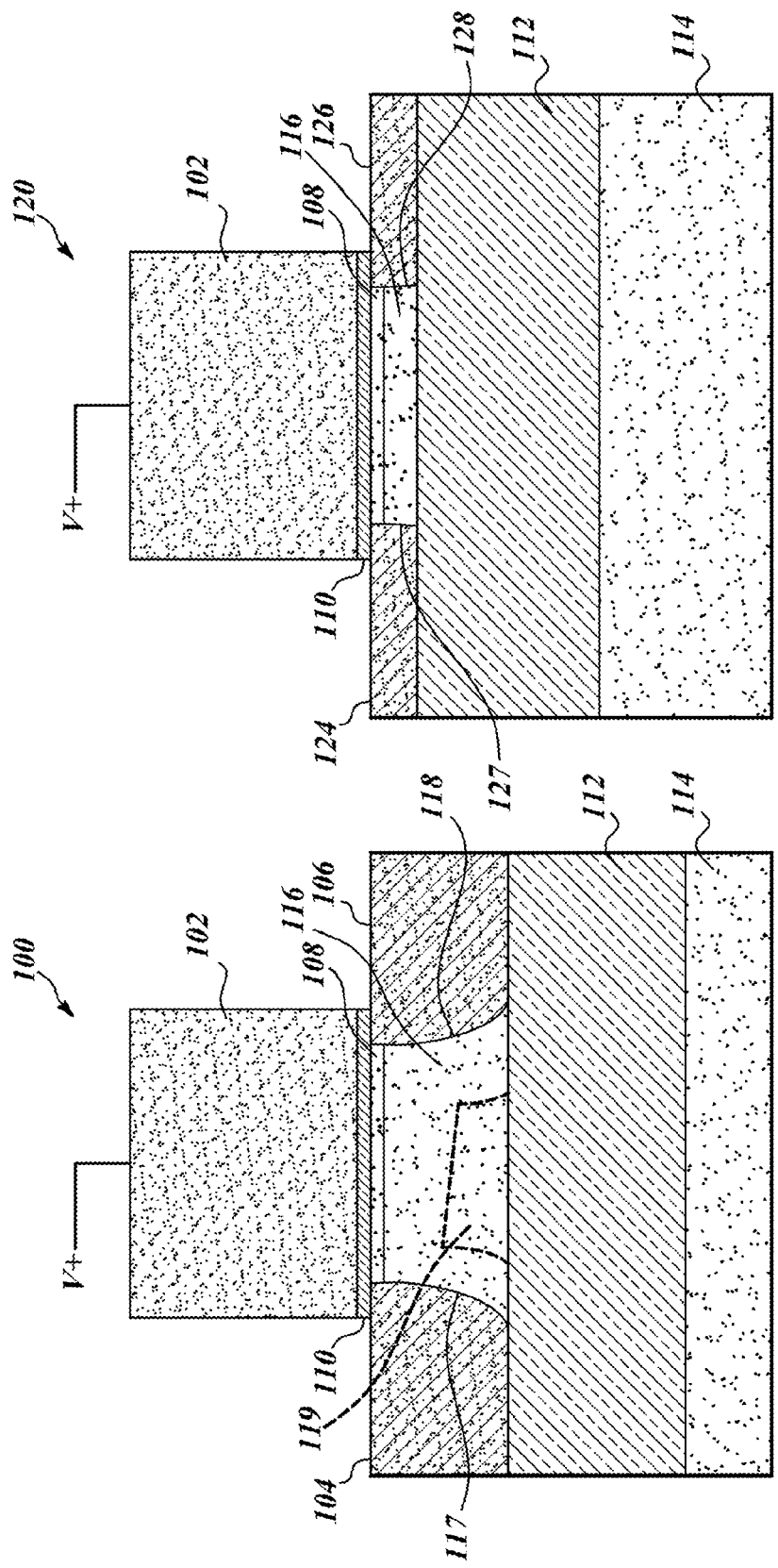
FIGS. 1A and 1B are cross sections of existing silicon-on-insulator devices that illustrate partially depleted and fully depleted channels.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases in "one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to analog microcircuits and FD-SOI transistor devices that have been produced; however, the present disclosure and the reference to certain materials, dimensions, and the details and ordering of processing steps are exemplary and should not be limited to those shown.

In the figures, identical reference numbers identify similar features or elements. The sizes and relative positions of the features in the figures are not necessarily drawn to scale.

FIGS. 1A and 1B provide general information about SOI transistors, familiar to those skilled in the art of transistor design. FIG. 1A shows a partially-depleted MOS SOI transistor 100 in cross section. Like standard bulk MOS transistors, the MOS SOI transistor 100 is a three-terminal device in which a voltage applied to a gate 102 causes current to flow between a source region 104 and a drain region 106 through a channel 108. The gate 102 is separated from the rest of the device by a thin capacitive gate oxide layer 110. The MOS SOI transistor 100 differs from a bulk MOS transistor in that there exists a buried oxide (BOX) layer 112 between the channel 108 and a bulk silicon substrate 114. A depletion region 116, depleted of charge, that forms below the channel 108, between the source and drain regions 104 and 106, is then bounded below by the BOX layer 112. Normally, the presence of the BOX layer prevents the substrate voltage from electrically influencing the channel 108. The extent of the depletion region then depends on the relative dimensions of the various layers, as well as source and drain doping profiles, 117 and 118, respectively, and doping concentrations of the source and drain regions. In the case of the partially-depleted SOI device shown in FIG. 1A, the depletion region 116 does not fill all of the material between the source and the drain, wherein an un-depleted portion 119 remains at an undetermined floating electric potential. The presence of the un-depleted portion 119 is generally undesirable because it is not well controlled, and yet the associated floating electric potential can electrically influence the channel and degrade the transistor performance.

An FD-SOI transistor 120 is shown in FIG. 1B in cross section. Like the partially depleted SOI transistor 100 shown in FIG. 1A, the FD-SOI transistor 120 also has a BOX layer 112. However, the source and drain regions, 124 and 126 respectively, of the FD-SOI device, are shallower than the corresponding source and drain regions, 104 and 106, respectively, of the partially depleted SOI transistor 100. As a result, doping profiles 127 and 128 are effectively vertical, and the charge characteristics of the channel can be set by the doping concentrations such that a fully charge-depleted region 116 forms between the shallow source and drain regions 124 and 126, bounded below by the BOX layer 112, in response to application of a bias voltage to the gate 102. Because all of the material between the source and drain is charge-depleted, the un-depleted portion 119 shown in FIG. 1A has been eliminated as a possible cause of transistor degradation.

Figure 2:
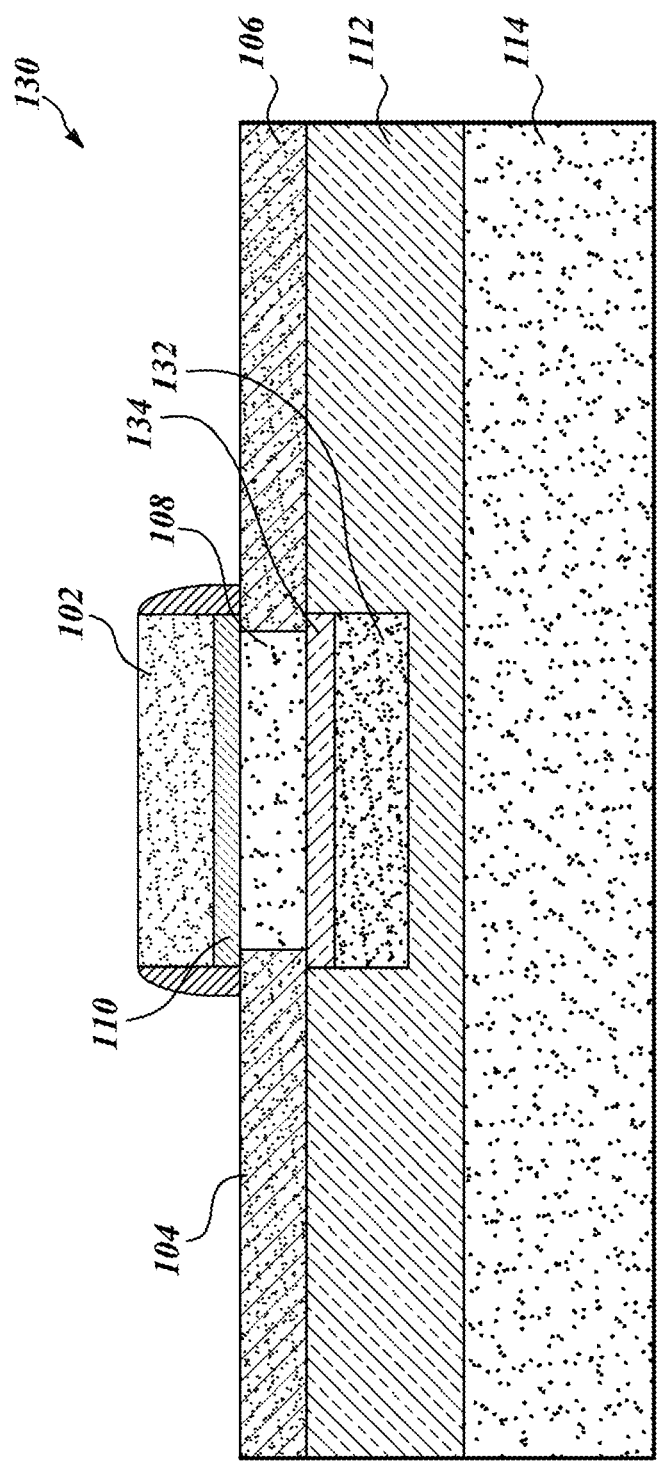
FIG. 2 is a cross section of one type of prior art dual gate SOI transistor.

FIG. 2 shows a generalized example of the architecture of a conventional dual gate SOI transistor 130 as shown in U.S. Patent Publication No. 2010/0264492. Like the conventional MOS and SOI devices, the conventional dual gate SOI transistor 130 has a primary gate 102, a source region 104 and a drain region 106 on either side of a channel 108, wherein the primary gate 102 is separated from the channel region 108 by a thin primary gate oxide layer 110. In addition, the conventional dual gate SOI transistor 130 includes a secondary gate 132, which is separated from the channel region 108 by a thin, secondary gate oxide layer 134. Both the primary and secondary gates 102 and 132 can be biased so as to influence current flow in the channel region 108, which is common to both gates. While the structure of FIG. 2 is known, its use as a capacitor in an operating circuit, such as an amplifier, is not known and is one embodiment of the invention as explained with respect to FIGS. 4B and 9C.

Figure 3:
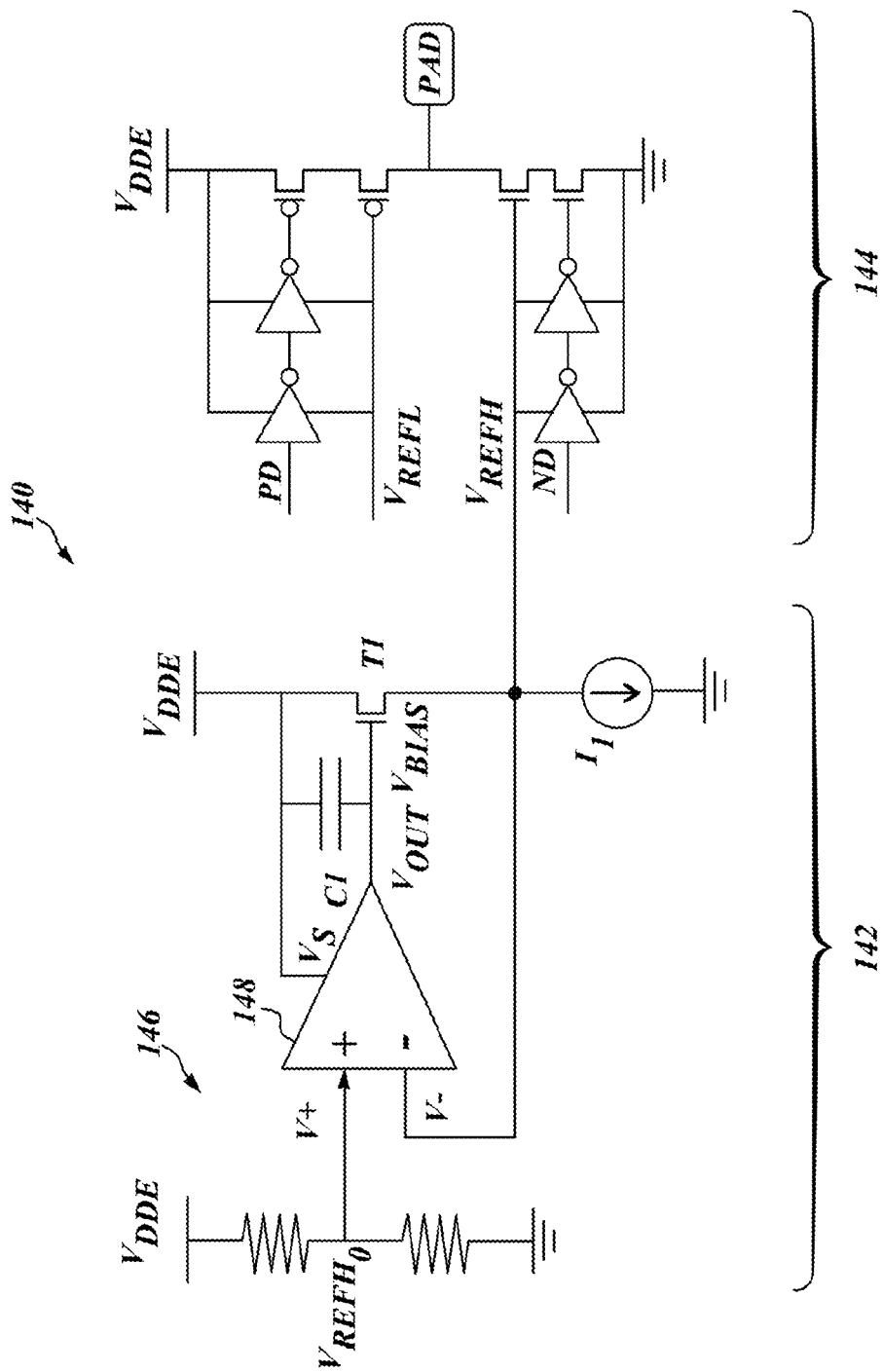
FIG. 3 is a schematic diagram of an existing reference voltage generator circuit that includes a passive well capacitance C1.

FIG. 3 shows a conventional reference voltage-based high voltage output buffer circuit 140 that uses low voltage devices. The high voltage output buffer circuit 140 includes a reference voltage generator stage 142 and an output driver stage 144. The output driver stage 144 as shown is a high voltage output driver. The reference voltage generator stage 142 includes a voltage divider 146 having an associated reference voltage $V_{REFH0}$, an operational amplifier (op-amp) 148, a capacitor C1, a transistor T1, and a current source 11. In FIG. 3, the capacitor C1 is a standard, well known parallel plate capacitor. The op-amp 148 includes three terminals: an inverting input $V^-$, a non-inverting input $V^+$, and an output $V_{out}$. An additional terminal $V_s$ is coupled to the power source $V_{DDE}$. Components internal to the op-amp 148 cause the differential input voltage $\Delta V_{IN} = V^+ - V^-$ to appear at the output terminal $V_{out}$, multiplied by an amplification factor, or gain, A, such that $V_{out} = A\Delta V_{IN}$. The output $V_{OUT}$ of op-amp 148 is connected to the gate of transistor T1 and its effective voltage is represented as $V_{BIAS}$. The op-amp 148 and transistor T1 are connected in negative feedback to form a unity gain buffer for input reference voltage $V_{REFH0}$ to produce the output reference voltage $V_{REFH}$ which will be used in the output driver 144. The capacitor C1 is used to improve the stability of negative feedback and is coupled between $V_{DDE}$ and $V_{BIAS}$ so that the voltage $\Delta V$ across C1 is $V_{DDE} - V_{BIAS}$.

Figure 4:
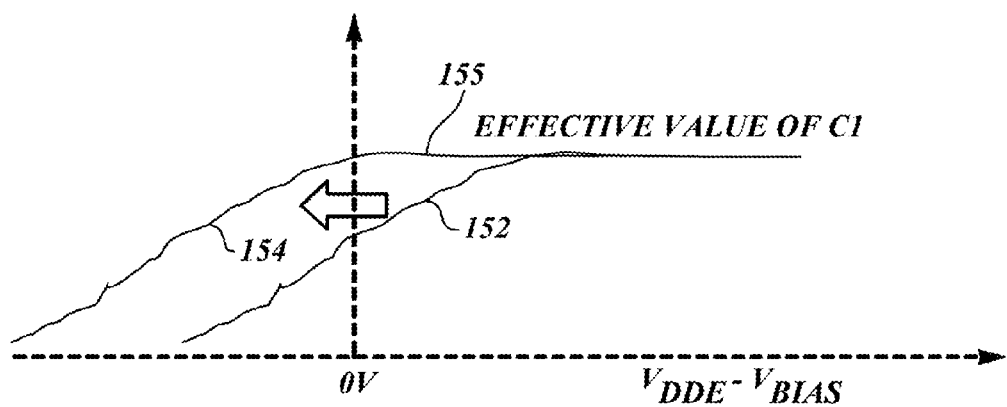
FIG. 4 is a plot of effective capacitance as a function of applied voltage across an NWELL capacitor.

To improve performance of the high voltage output driver stage 144, it is desirable to maximize the value of $V_{REFH}$, and in turn, to maximize $V_{BIAS}$. Furthermore, it may be desirable to substitute an MOS transistor for the capacitor C1. The effective capacitance of the MOS transistor varies with applied voltage. It can be useful, when designing such an MOS device, to evaluate the effective capacitance for different applied voltages $\Delta V$ by plotting a C-V curve that is determined from simulated or actual measurements of the MOS device. Such a C-V curve is shown in FIG. 4. As $V_{BIAS}$ increases, the voltage across C1 decreases and the effective value of C1 decreases according to the curve 152. As the effective value of C1 decreases, the stability of negative feedback in reference voltage generator stage 142 degrades and hence leads the reference voltage generator circuit towards instability, varying significantly in response to small changes in the voltage across C1. It is desirable to reduce such bias-dependent behavior of the reference voltage generator stage 142 by shifting the C-V curve 152 to the left, to produce a desired C-V curve 154 that has an extended flat region 155. According to the C-V curve 154, at around 0V, the capacitance value C1 remains substantially constant in response to variations in the voltage across C1.

The present inventor has realized that, while it is not possible to produce the desired C-V curve 154 when C1 is a conventional bulk MOS transistor, it is possible to achieve an improved C-V curve when a dual gate SOI transistor of the type shown in FIG. 2 is used. While this dual gate SOI transistor of FIG. 2 is known as a standalone component, the inventors have realized that using it in a circuit of the type shown in FIG. 5 provides a first level of improved behavior of the C-V curve and circuit operation, as shown in FIG. 8D, explained later.

In addition, the inventors also realized that a significantly improved C-V curve 154 results when C1 is formed using a dual gate PMOS FD-SOI transistor. One such circuit configuration that incorporates a dual gate PMOS FD-SOI transistor as the capacitor C1 is shown in FIG. 5 as the FD-SOI reference voltage based output driver circuit 160 having a modified reference voltage generator stage 162. Comparing FIG. 5 with FIG. 3, in the modified reference voltage generator stage 162, C1 has been replaced by a dual gate SOI transistor. In one embodiment, the dual gate SOI transistor is a dual gate PMOS FD-SOI transistor 164 indicated by a dotted circle. A primary gate of the dual gate SOI or dual gate PMOS FD-SOI transistor 164 is coupled to the output of the op-amp 148 at the voltage $V_{BIAS}$. Source and drain terminals of the dual gate SOI or dual gate PMOS FD-SOI transistor 164 are both coupled to the supply voltage $V_{DDE}$, and the secondary gate 132 of the dual gate SOI or dual gate PMOS FD-SOI transistor 164 is grounded.

Figure 5:
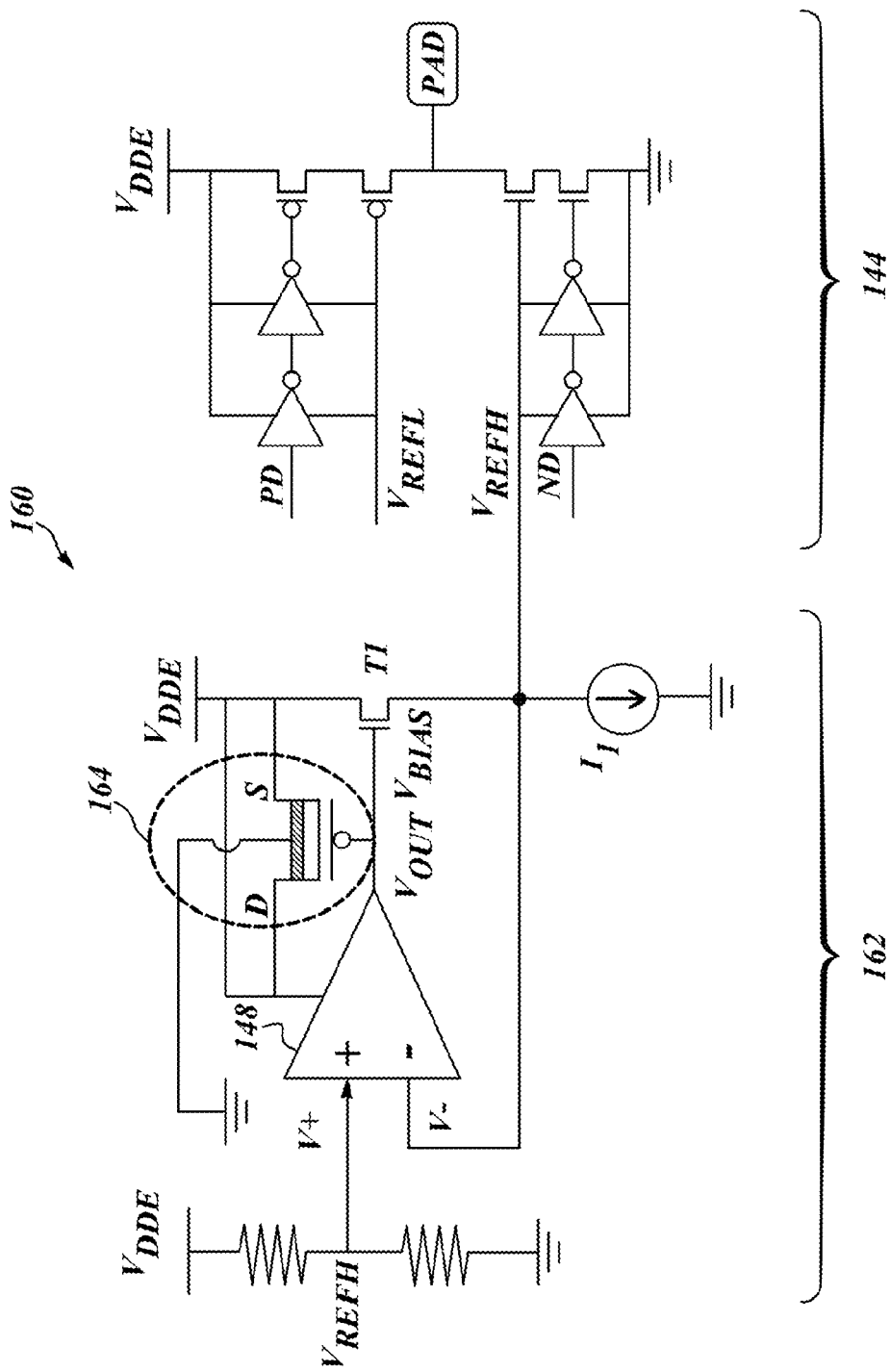
FIG. 5 is a schematic diagram of a reference voltage generator circuit that includes a dual gate FD-SOI MOSFET device, as described herein.

A portion of the modified reference voltage generator stage 162 shown in FIG. 5 is further detailed in FIG. 6A, in which the dual gate PMOS FD-SOI transistor 164 is represented in physical cross-section with some schematic lines. One alternative embodiment of the cross-section shown in FIG. 6A more clearly shows the capacitive structure of the dual gate PMOS FD-SOI transistor 164. FIG. 6A can be compared with the cross-section of the conventional dual gate SOI transistor 130 shown in FIG. 2. In the dual gate SOI transistor 130 of FIG. 2, the channel 108 can be controlled by either a voltage applied to the primary gate 102, or by a voltage applied to the secondary gate 132. When such a transistor is used as a capacitor, the voltage difference between the primary and secondary gates is applied across both gate dielectrics 110, 134.

Turning now to FIG. 6A, parts of the dual gate PMOS FD-SOI transistor 164 include the primary gate 102, the source 104, the drain 106, and the BOX 112. The source 104 and drain 106 are doped P-type and the channel 165 is doped N-type. Inventive parts of the PMOS FD-SOI transistor 164 include a BOX-influenced channel 165, an NWELL region 167 used as a secondary gate, and an NWELL contact 166. In the embodiment shown in FIG. 6A, the function of the secondary gate 132 is carried out by the substrate, which is doped to form the NWELL region 167, in one embodiment. A voltage can be applied to the NWELL region 167 of the substrate via the front side NWELL contact 166, which is grounded in the embodiment shown. The secondary gate, NWELL region 167, is spaced apart from the channel 165 by a large gate oxide layer, which, in the embodiment shown in FIG. 6A, is the BOX layer 112. An alternative, flip well embodiment shown in FIG. 6B provides a PWELL 168 as the secondary gate.

FIG. 6C shows schematically the capacitances present in the dual gate PMOS FD-SOI transistors 164 and 163 shown in FIGS. 6A and 6B, respectively. Between $V_{BIAS}$ and ground, there exist at least two capacitances, $C_{gate}$ across the primary gate oxide layer 110 using the gate 102 and the source/drain/channel as the first and second electrodes, respectively, and $C_{box}$ across the BOX layer 112 that uses the well region as one electrode and the source/drain/channel as the other electrode. The BOX layer 112 provides a much thicker dielectric than does the gate oxide layer 110. Hence, higher voltage can be applied across the BOX layer 112 by biasing the back gate terminal NWELL of the PMOS at a desired voltage level for example, in one configuration shown in FIG. 6A, it is connected to the ground. By connecting the NWELL at ground it helps in creating the channel from the back side and hence it increases the effective value of $C_{GATE}$ capacitance at a lower value of $V_{DDE}$-$V_{BIAS}$ at which the channel produced by front gate is weak. Therefore by using the backgate bias voltage the C-V curve 152 is modified to produce the desired C-V curve 154. In addition to improving the C-V behavior of $C_{GATE}$ by connecting the NWELL to ground, the back gate gives an additional capacitance $C_{box}$, connected between $V_{DDE}$ and ground, and hence it works as a decoupling capacitor between supply and ground.

Figure 7:
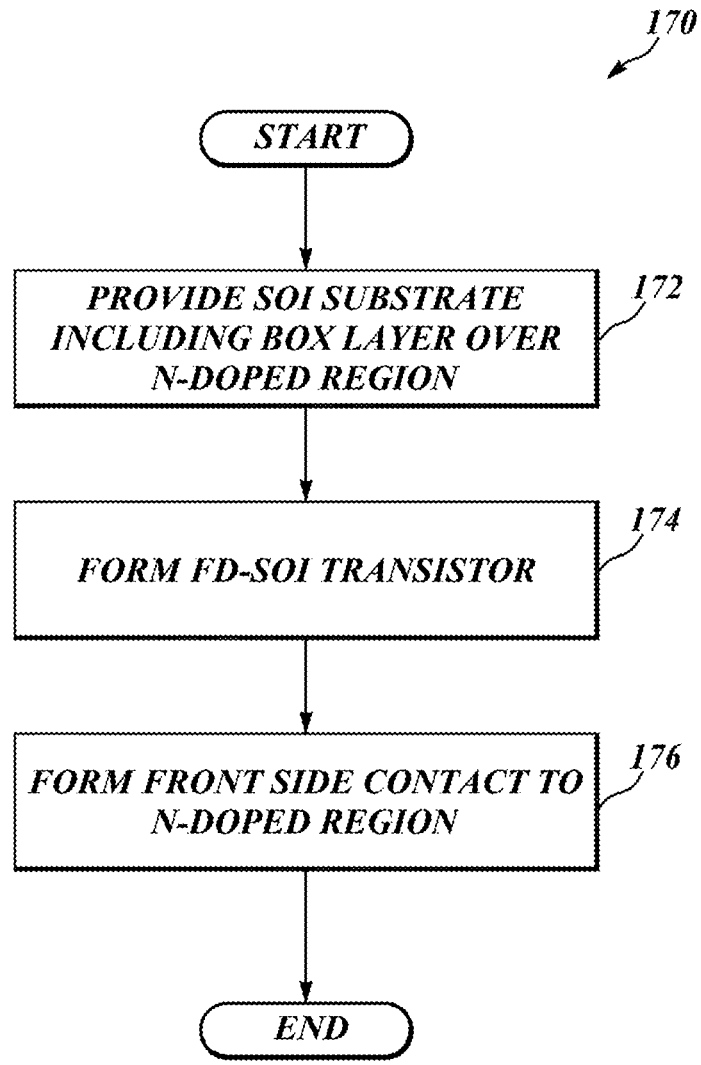
FIG. 7 is a flow diagram of steps in a process of fabricating the dual gate PMOS FD-SOI MOSFET shown in FIG. 6A.

FIG. 7 shows high level steps in a method 170 of making the dual gate PMOS FD-SOI transistor 164.

At 172, a starting material is provided as a silicon-on-insulator (SOI) semiconductor wafer that includes the BOX layer 112 deposited over a heavily n-doped region, referred to as the NWELL region 167. The BOX layer 112 has a thickness greater than the front gate so that it can sustain application of up to about ±3.3 V to the NWELL region 167 without experiencing a structural breakdown.

At 174, a field effect transistor is formed by conventional methods used for SOI wafers to provide a top layer of silicon that covers the BOX layer 112. The fully depleted (FD) channel 165 can be achieved by making profiles of the source and drain regions substantially vertical so they are perpendicular to the BOX layer 112.

At 176, the front side NWELL contact 166 can be formed to couple a selected voltage to the secondary gate, which is the NWELL region 167. The front side contact can be made of one or more typical contact metals such as aluminum, tungsten, gold, and the like, or combinations thereof.

A method of operation in which the dual gate PMOS FD-SOI transistor 164 is used as the integrated capacitor C1 entails grounding the NWELL region 167 acting as the secondary gate, coupling both the source and drain regions 104 and 106, respectively, to the supply voltage, $V_{DDE}$, and applying a voltage $V_{BIAS}$ to the primary gate 102.

FIGS. 8A-8C show three different options for the capacitor C1 for use in, for example, the reference voltage generator circuits 140 and 160. FIG. 8D compares the simulated device performance of each capacitor option. With reference to FIG. 8A, C1 is a conventional integrated PWELL capacitor of the type well known in the art. The PWELL capacitor is simulated with one plate tied to a supply voltage $V_{DDE}$=3.3 V while the other plate is tied to a variable bias voltage $V_{BIAS}$. The supply voltage $V_{DDE}$=3.3 V can be considered a maximum value of $V_{BIAS}$.

Turning now to FIG. 8B, a capacitor option is shown in which C1 is replaced by a dual gate SOI transistor, CPMOS0, as shown in FIG. 2. The primary gate 102 is biased at the voltage $V_{BIAS}$ and the secondary gate 132, source 104, and drain 106 are all tied to the supply voltage at 3.3 V. Thus, the secondary gate 132 is not used as a fourth terminal separate from the source and drain. This connection provides improved performance, as will be shown.

With reference to FIG. 8C, the capacitance C1 is provided by the dual gate PMOS FD-SOI transistor 164 in which the primary gate 102 is biased at the voltage $V_{BIAS}$, the source 104, and drain 106 are both tied to the supply voltage at 3.3 V, and the secondary gate 132 is grounded. When the dual gate PMOS FD-SOI transistor 164 is substituted for the capacitor C1, it provides significantly improved performance for use in the circuit of FIG. 5.

FIG. 8D presents device simulations of the alternative embodiments for providing the capacitance C1 shown in FIGS. 8A-8C. A family of C-V characteristic plots 190 comparing simulated performance of the different capacitor options at the device level shows that the FD-SOI reference voltage-based output driver circuit 160 having a modified reference voltage generator stage 162 would significantly outperform the conventional output buffer circuit 140 having a reference voltage generator stage 142 with a well capacitor. The family of C-V characteristic plots 190 shows capacitance values calculated in femtofarads, at various bias voltages for the three choices of C1 described above.

The C-V curve 192 corresponds to the PWELL capacitor C1 of FIG. 8A. The capacitance value starts out high, at about 200 fF when $V_{BIAS}$ is under 1.5 volts, but declines gradually to about 100 fF at $V_{BIAS}$ of 3.0 volts and to only 65 fF when $V_{BIAS}$ is 3.3 volts.

The C-V curve 194 corresponds to a dual gate transistor CPMOS0, such as the one shown in FIG. 2, exhibiting a more abrupt change, however, the transition occurs at a low voltage. In contrast to the C-V curve 192, the capacitance value drops rapidly for curve 194 associated with the conventional dual gate PMOS transistor CPMOS0, starting to decline at about 2.5 volts and falling in a near vertical line to reach a low capacitance, below 40 fF when $V_{BIAS}$ is about 2.9 volts. As $V_{BIAS}$ reaches its maximum voltage of 3.3 volts, the conventional dual gate PMOS transistor CPMOS0 has a value of only about 35 fF as noted when the line 194 crosses the dotted line 198 at 3.3 volts.

The C-V curve 196 corresponds to the dual gate FDSOI transistor 164 described herein, CPMOS1. Over the entire range of $V_{BIAS}$, the transistor 164 performs better than the standard capacitor or the conventional dual gate transistor, because the capacitance remains constant up to the highest value of $V_{BIAS}$, and the capacitance value at 3.3 V is the highest. The improved device performance indicated by the simulation curve 196 predicts a commensurate improvement in circuit performance if the dual gate FDSOI transistor 164 is substituted for the capacitor C1 in the circuit of FIG. 5. In particular, the C-V curve 196 shows a capacitance value of 130 fF at a bias voltage of 3.3V, which is twice the best value measured for the reference voltage generator stage 142. Thus, the dual gate PMOS FD-SOI transistor 164, when used as the capacitor C1 and connected as shown, is expected to operate closer to a constant, stable, capacitance value, i.e., in the flat region of the C-V curve, as opposed to the steep linear region or, worse, the bottom of the C-V curve for most of the values of $V_{BIAS}$ from 0 volts to about 3.0 volts, which fails to provide a significant capacitance value at applied bias voltages in the range of about 2.6-3.3 V.

Figures 9A, 9B:
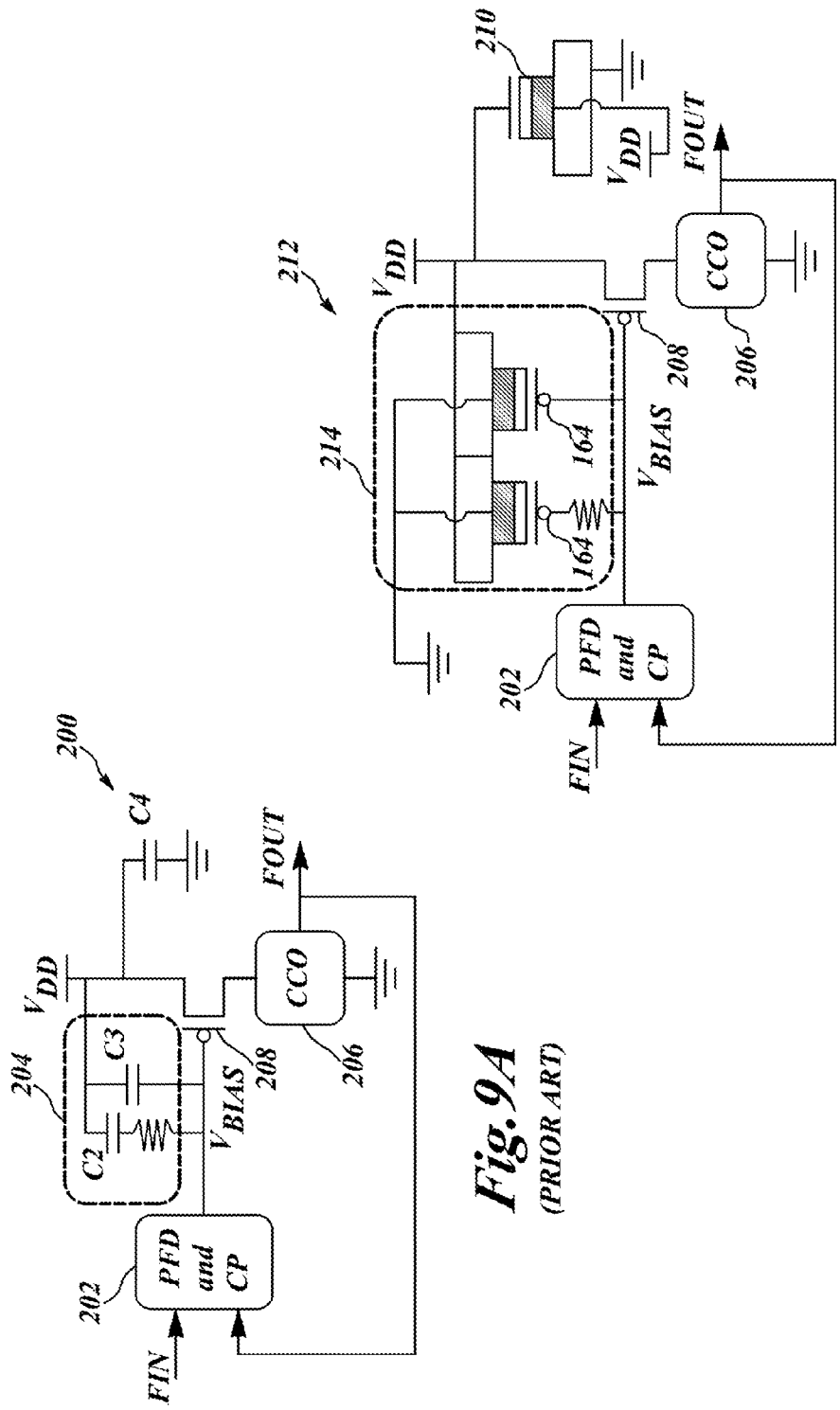
FIG. 9A is a schematic diagram of a prior art charge pump phase locked loop circuit that includes three capacitors.
FIG. 9B is a schematic diagram of a charge pump phase locked loop circuit that includes three capacitive dual gate FD-SOI MOSFET devices, as described herein.

FIG. 9A shows a conventional charge-pumped phase locked loop (CP-PLL) circuit 200. The conventional CP-PLL circuit 200 includes an input stage 202, a filter stage 204, and an output stage 206 separated from the filter stage 204 by a PMOS transistor 208. In one embodiment, the input stage 202 includes a phase frequency detector and a charge pump, and the filter stage 204 includes two loop filter capacitors C2 and C3 coupled between a supply voltage $V_{DD}$ and the gate of the PMOS transistor 208. The output stage 206 includes a current controlled oscillator (CCO). The output stage 206 is coupled to the input stage 202, forming a feedback control loop. A de-coupling capacitor C4 is connected between $V_{DD}$ and ground.

To improve performance of the conventional CP-PLL circuit 200, it is desirable to reduce variation of the loop filter capacitors C2 and C3 when the conventional CP-PLL circuit 200 is operated at a lower supply voltage for example $V_{DD}$=1.2 V. The present inventor has understood that it is possible to achieve the much improved CP-PLL performance by replacing each of capacitors C2 and C3 with a PMOS FD-SOI transistor 164, and also by replacing the de-coupling capacitor C4 with a flip-well dual gate NMOS FD-SOI transistor 210. Such a circuit configuration that incorporates a dual gate PMOS FD-SOI transistor 164 in place of the capacitors C2 and C3, and a flip-well dual gate NMOS FD-SOI transistor 210 in place of the de-coupling capacitor C4, is shown in FIG. 9B as the FD-SOI charge-pumped phase locked loop (CP-PLL) circuit 212, having a modified filter stage 214. Comparing FIG. 9B with FIG. 9A, in the modified filter stage 214, primary gates of the dual gate PMOS FD-SOI transistors 164 are coupled to the output of the charge pump stage 202 at the voltage $V_{BIAS}$ and to the gate of the PMOS transistor 208; source and drain terminals of the dual gate PMOS FD-SOI transistors 164 are coupled to the supply voltage $V_{DD}$; and the secondary gates of the dual gate PMOS FD-SOI transistors 164 are grounded. Furthermore, both primary and secondary gates of the flip-well dual gate NMOS FD-SOI transistor 210 are coupled to the supply voltage $V_{DD}$, while the source and drain terminals of the flip-well dual gate NMOS FD-SOI transistor 210 are grounded. A capacitor of the type shown in FIG. 8B could also be used for C2-C4 in the circuit of FIG. 9B.

The modified de-coupling capacitor C4 shown in FIG. 9B is further detailed in FIGS. 10A and 10B in which the flip-well dual gate NMOS FD-SOI transistor 210 is represented in cross-section, and schematically, respectively. The cross-sectional view shown in FIG. 10A more clearly shows the capacitive structure of the flip-well dual gate NMOS FD-SOI transistor 210, in which the source 104 and drain 106 are doped N-type, and the channel 165 is lightly doped P-type. The flip-well dual gate NMOS FD-SOI transistor 210 shown in FIG. 10A can be compared directly with the dual gate PMOS FD-SOI transistor 164 shown in FIG. 6A. For the application described herein, the source and drain terminals of the flip-well dual gate NMOS FD-SOI transistor 210 are grounded. In the flip-well dual gate NMOS FD-SOI transistor 210, the channel 165 can be controlled by either a voltage $V_{BIAS}$ applied to the primary gate 102, or by a voltage applied to the secondary gate 167. In the embodiment shown, the secondary gate is the substrate which is doped to form an NWELL region 167. A supply voltage $V_{DD}$ can be applied to the NWELL region 167 of the substrate via a front side NWELL contact 166. The secondary gate is spaced apart from the channel 165 by the gate oxide which, in the embodiment shown, is the same as the BOX layer 112.

In the embodiment shown in FIG. 10A, the NMOS device is formed in an NWELL, instead of the conventional way, which would be in a PWELL. Such a device is known to those skilled in the art of FD-SOI devices as a flip-well FD-SOI transistor, e.g., CNMOS2FW. An alternative embodiment shown in FIG. 10B provides a PWELL 168 as the secondary gate.

FIG. 10C shows schematically the capacitances present in the flip-well dual gate NMOS FD-SOI transistors 210 and 211 shown in FIGS. 10A and 10B, respectively. There exist two parallel capacitances within the dual gate NMOS FD-SOI transistor, $C_{gate}$ across the regular gate oxide layer 110, and $C_{box}$ across the BOX layer 112. $C_{box}$ thus acts as a de-coupling capacitor between $V_{DD}$ and ground. Hence, the size of the de-coupling capacitor needed can be smaller. In addition, by connecting the back gate NWELL to VDD, a channel is created from the back side, and hence improves the C-V behavior of $C_{gate}$ at a lower value of $V_{BIAS}$.

A method of operation in which the flip-well dual gate NMOS FD-SOI transistor 210 is used as the integrated capacitor C4, entails grounding the source and drain terminals 104 and 106, respectively, coupling the NWELL region 167 of the substrate to the supply voltage, $V_{DD}$, and applying a bias voltage to the primary gate 102.

Figures 11A, 11B, 11C, 11D, 11E:
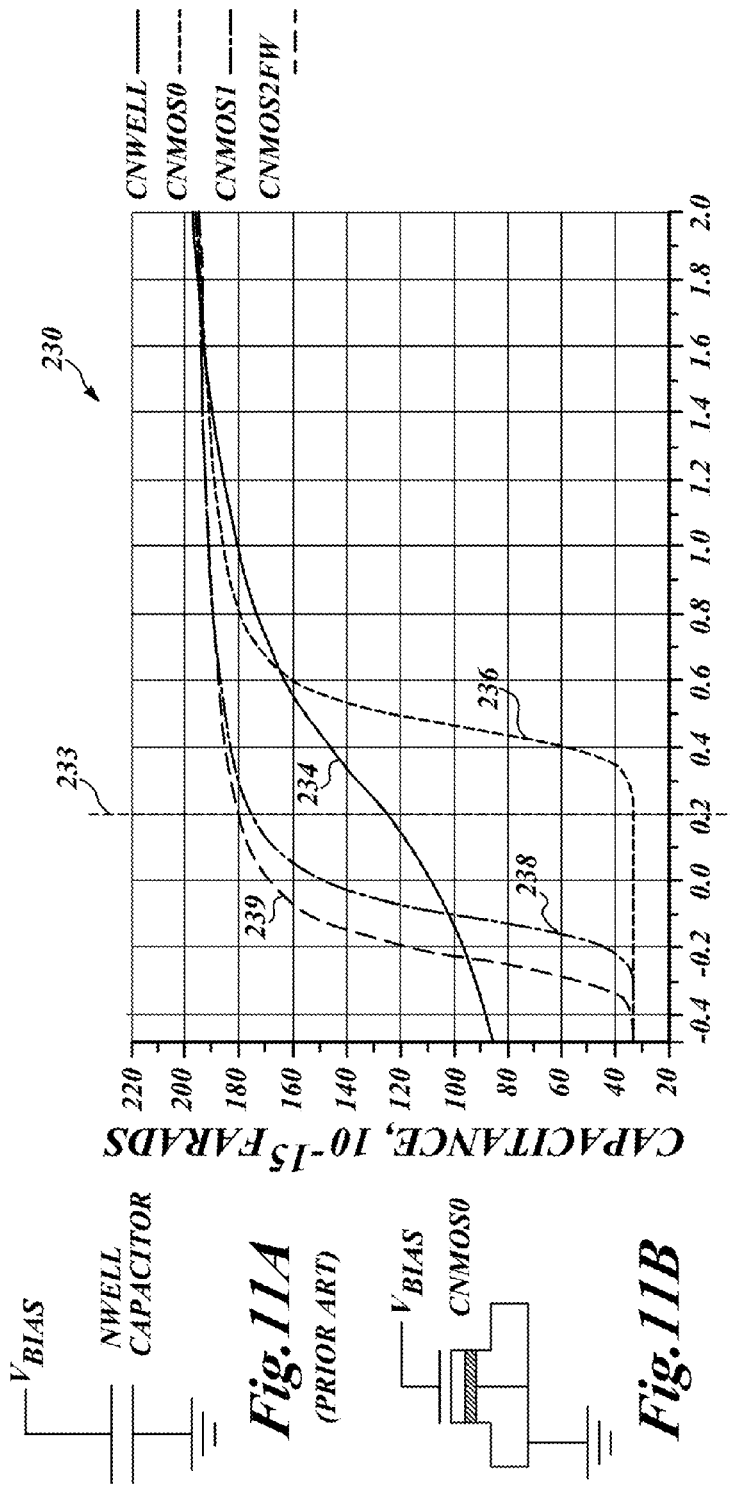
FIG. 11A is a schematic diagram of a conventional NWELL capacitor to which a bias voltage is applied.
FIG. 11B is a schematic diagram of a dual gate NMOS transistor for use as a capacitor in a circuit having an applied bias voltage.
FIG. 11C is a schematic diagram of an FD-SOI dual gate NMOS transistor for use as a capacitor in a circuit having a supply voltage of 3.3 V, as described herein.
FIG. 11D is a schematic diagram of a flip-well FD-SOI dual gate NMOS transistor CNMOSFW, for use as a capacitor in a circuit having a supply voltage of 3.3 V, as described herein.
FIG. 11E is a plot of simulated C-V curves for the device configurations shown in FIGS. 11A-11D.

FIGS. 11A-11D show four different options for providing a decoupling capacitance (DCAP) C4 for use in a FD-SOI CP-PLL circuit 212, along with a comparison of the simulated device performance of each option. In FIG. 11A, DCAP C4 is an NWELL parallel plate capacitor, having one plate tied to the variable bias voltage and the other plate grounded.

With reference to FIG. 11B, the capacitance C4 is provided by a dual gate SOI transistor CNMOS0, in which the primary gate is biased at the voltage $V_{BIAS}$ and the secondary gate, source, and drain are all grounded.

With reference to FIG. 11C, in a configuration as presented herein, C4 is replaced by the flip well dual gate NMOS FD-SOI transistor 210 in which the primary gate is biased at the voltage $V_{BIAS}$, the source, and drain are both grounded, and the secondary gate is tied to the supply voltage at 3.3 V.

With reference to FIG. 11D, in a configuration as presented herein, C4 is replaced by a dual gate NMOS FD-SOI transistor 211 in which the primary gate is biased at the voltage $V_{BIAS}$, the source, and drain are both grounded, and the secondary gate is tied to the supply voltage at 3.3 V. The dual gate NMOS FD-SOI transistor 211 is similar to the flip-well dual gate NMOS FD-SOI transistor 210, except that the substrate is P-doped to form a PWELL instead of the NWELL 167.

FIG. 11E shows superior performance of the flip-well dual gate NMOS FD-SOI transistor 210 operated according to the method of operation 220. A family of C-V characteristic plots 230 provides a comparison of different options for the DCAP in the FD-SOI CP-PLL circuit 212, having a modified filter stage 214. The family of C-V characteristic plots 230 shows capacitance values calculated in femtofarads, at various bias voltages for the four choices of C4 described above. For example, at the maximum bias voltage of 1.8 V, all of the choices for C4 deliver capacitance values 232 in the range of about 180-200 fF. However, as the bias voltage decreases to as low as 0.2 V as indicated by the dotted line 233, capacitance values indicated by the C-V curves 234 and 236, corresponding to the conventional CNWELL parallel plate capacitor C4 and the CNMOS0 transistor, respectively, drop to about 125 fF and 35 fF, respectively. Meanwhile, the C-V curves 238 and 239 simulating the NMOS FD-SOI transistor 211, and a flip-well version of the NMOS FD-SOI transistor 210 respectively, used for the capacitor C4, show capacitance values are maintained in the range of about 170-180 fF. Thus, the dual gate NMOS FD-SOI transistor 210, operates at a constant, stable, capacitance value, i.e., in the flat region of the C-V curve, as opposed to the steep linear region or, worse, the bottom of the C-V curve, which fails to provide a significant capacitance value at operating voltages below about 0.6 V. The simulated C-V curves for the various devices shown in FIGS. 11A-11D thus suggest that the transistor 210 would outperform the other capacitance options when substituted for C4 in the circuit 212. Furthermore, the simulations shown in FIG. 11E indicate that the flip-well NMOS FD-SOI transistor 210 significantly outperforms the NMOS FD-SOI transistor 211 that is formed in a PWELL according to the standard method.

FIGS. 12A-12E show four different options for operating P-doped capacitive devices at a supply voltage $V_{DD}$=1.2 V, along with a comparison of the simulated device performance of each option. In one conventional configuration shown in FIG. 12A, a standard parallel plate PWELL capacitor has one plate tied to $V_{DD}$ while the other plate is tied to a variable bias voltage, $V_{BIAS}$. In another configuration, a dual gate transistor device, CPMOS0, has $V_{BIAS}$ applied to the primary gate while the secondary gate, source, and drain are all tied to the supply voltage at 1.2 V. In third and fourth configurations as described herein, dual gate PMOS FD-SOI transistors CPMOS1 164 and CPMOS2FW flip-well transistor 163 have a primary gate biased at the voltage $V_{BIAS}$, while the source, and drain are both tied to the supply voltage at 1.2 V, and the secondary gate is grounded.

FIG. 12E shows superior performance of the dual gate PMOS FD-SOI transistor 164, operated at the 1.2 V supply voltage according to the method of operation 180. A family of C-V characteristic plots 240 provides a comparison of the four device options shown in FIGS. 12A-12D. The family of C-V characteristic plots 240 shows capacitance values calculated in femtofarads, at various bias voltages for the four options described above. The C-V curves 241, 242, and 246 for the conventional CPWELL, CPMOS0, and CPMOS2FW devices, respectively show that the capacitance values decrease sharply as the variable bias voltage $V_{BIAS}$ exceeds about 0.6 V. In such cases, an additional passive PWELL capacitor is needed. In contrast, the C-V curve 244 that corresponds to the dual gate FD-SOI devices CPMOS1 164, still provides capacitances at, for example, a high bias voltage of 0.9 V, exceeding 100 fF, compared with about 35 fF for the other devices. Thus, the inventive dual gate PMOS FD-SOI transistors when used with a supply voltage of 1.2 V, provide higher capacitance values for a wider range of bias voltages than the other devices provide. In such cases, the passive PWELL capacitor can be replaced with an active PMOS device. The simulations shown in FIG. 12E indicate that the flip-well PMOS FD-SOI transistor 163 performs only marginally better than the CPMOS0 transistor 242, while the performance of the PMOS FD-SOI transistor 163 formed in an NWELL significantly outperforms the CPMOS0 bulk transistor.

FIGS. 13A-13D show four different options for operating N-doped capacitive devices at a supply voltage $V_{DD}$=1.2 V, along with a comparison of the performance of each option. In one conventional configuration a standard parallel plate NWELL capacitor has one plate tied to $V_{BIAS}$ while the other plate is grounded. In another configuration, a dual gate SOI transistor device, CNMOS0, has $V_{BIAS}$ applied to the primary gate while the secondary gate, source, and drain are all grounded. In third and fourth configurations as described herein, dual gate NMOS FD-SOI transistors CNMOS1 and CNMOS2FW have a primary gate biased at the voltage $V_{BIAS}$, while the source and drain are both grounded, and the secondary gate is tied to the supply voltage at 1.2 V.

FIG. 13E shows superior performance of the dual gate NMOS FD-SOI transistor 210, operated at the 1.2 V supply voltage according to the method of operation 220. A family of C-V characteristic plots 250 provides a comparison of the four device options shown in FIGS. 15A-15D. The family of C-V characteristic plots 250 shows capacitance values calculated in femtofarads, at various bias voltages for the four options described above. The C-V curves 251 and 252 for the conventional CNWELL and CNMOS0 devices, respectively, show that the capacitance values decrease sharply as the variable bias voltage $V_{BIAS}$ drops below about 0.6 V. In contrast, the C-V curves 254 and 256, that correspond to the inventive dual gate FD-SOI devices CNMOS1 211 and CNMOS2FW flip-well 210, still provide relatively high capacitances at, for example, a low bias voltage of 0.4 V, of about 160-180 fF, compared with only about 70-145 fF for the conventional devices. Thus, the dual gate NMOS FD-SOI transistors 211 and 210 when used with a supply voltage of 1.2 V, provide higher capacitance values for a wider range of bias voltages than the conventional devices provide. The simulations shown in FIG. 13E indicate that the flip-well NMOS FD-SOI transistor 210 outperforms the NMOS FD-SOI transistor 211 that is formed in a PWELL according to the standard method.

In addition to improvements in performance and stability of analog circuit applications that use dual gate FDSOI MOSFET devices in place of capacitors, such substitutions have other advantages. For example, when passive capacitors can be eliminated from analog circuit designs by substituting dual gate FDSOI MOSFET devices, an additional mask is no longer needed to form the passive capacitors. Thus, the fabrication process is simplified, especially for high voltage designs having a supply voltage in the range of about 1.8 V-3.6 V. A simpler process tends to produce higher yields. In addition, the chip real estate needed for the dual gate FDSOI MOSFET capacitors can be up to 50% smaller than that needed for conventional passive capacitors for the same value of capacitance needed to stabilize an analog node. Another circuit size reduction is possible because fewer decoupling capacitors are needed due to the additional capacitance provided by the BOX layer present in the SOI substrate. As the thickness of the BOX layer shrinks in future technology generations, the associated de-coupling capacitance will increase and allow further savings in chip real estate.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

In the embodiments discussed here the back gate of FD-SOI devices is connected to $V_{DD}$ for NMOS FD-SOI devices and connected to ground for PMOS FD-SOI devices. However, it is not so limited. The back gate alternatively can be connected to an intermediate voltage, provided that the intermediate voltage is sufficient to create the channel from the back side.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microcircuit, comprising:
   a voltage supply;
   an operational amplifier electrically coupled to the voltage supply, the operational amplifier having inverting and non-inverting input terminals and an output terminal; and
   a dual gate capacitive field effect transistor including:
      a primary gate coupled to the output terminal of the operational amplifier;
      a secondary gate coupled to a ground reference voltage;
      a source region coupled to the voltage supply; and
      a drain region coupled to the voltage supply, the transistor including a doped substrate and a buried oxide layer on the doped substrate, and a decoupling capacitor having a first electrode including the source and drain regions and a second electrode including the secondary gate.

2. The microcircuit of claim 1 wherein the doped substrate functions as the secondary gate.

3. The microcircuit of claim 1 wherein the primary and secondary gates of the capacitive dual gate field effect transistor are coupled to different voltages to create different charge characteristics in a channel.

4. The microcircuit of claim 1, further comprising:
   a current source coupled to the inverting input terminal;
   a transistor coupled between the output terminal and the current source; and
   a voltage divider coupled to the voltage supply and the non-inverting input terminal; the microcircuit being operable as a reference voltage generator.

5. A microcircuit, comprising:
   an input stage that receives an input signal at an input frequency;
   an output stage that produces an output signal at an output frequency, the output signal coupled to the input stage; and
   a filter stage coupled between the input stage and the output stage, the filter stage including a pair of capacitors in the form of dual gate transistors, each of the pair of dual gate transistors including:
      a primary gate coupled to an output of the input stage;
      a secondary gate coupled to a reference voltage; and
      source and drain regions coupled to a voltage supply,
   the filter stage further including a decoupling capacitor in the form of a dual gate transistor that includes:
      a primary gate coupled to the voltage supply;
      a secondary gate coupled to the voltage supply; and
      source and drain regions coupled to an electrical ground.

6. The microcircuit of claim 5 wherein the filter stage is operable as a loop filter.

7. The microcircuit of claim 5 wherein the capacitors in the filter stage are PMOS dual gate transistors and the decoupling capacitor is an NMOS dual gate transistor.

8. The microcircuit of claim 5 wherein one or more of the dual gate transistors is a fully-depleted SOI dual gate transistor.

9. The microcircuit of claim 5 wherein
   the input stage includes a phase frequency detector and a charge pump;
   the output stage includes a PMOS field effect transistor and a current controlled oscillator; and
   the microcircuit is operable as a charge pumped phase locked loop circuit.

10. A device, comprising:
   a silicon-on-insulator (SOI) substrate including a doped well having a first conductivity type and a buried oxide layer on the doped well;
   a capacitive dual gate field effect transistor (FET) in an active layer of the SOI substrate, the capacitive dual gate FET including a channel region and source and drain regions, the source and drain regions having a second conductivity type and having respective substantially vertical profiles in abutting contact with the channel region and oriented perpendicular to the buried oxide layer, the source and drain regions being commonly coupled to a first voltage; and a front side contact to the doped well having the first conductivity type, the front side contact and the doped well being coupled to an electrical ground, wherein the source region, drain region and channel region operatively form a first electrode of a decoupling capacitor, and the doped well operatively forms a second electrode of the decoupling capacitor.

11. The device of claim 10 wherein the doped well is an N-well and the FET is a p-type device.

12. The device of claim 10 wherein the doped well is a P-well and the FET is an n-type device.

13. The device of claim 10, further comprising:

an interconnect that couples the source and drain regions to a power supply, the power supply being configured to supply the first voltage.

14. The device of claim 10, further comprising:

a primary gate oxide layer that is substantially thinner than the buried oxide layer; and a primary gate adjacent to the primary gate oxide layer, the primary gate configured to apply a bias voltage across the primary gate oxide layer.

15. The device of claim 10, wherein the buried oxide layer is configured as a second capacitive dielectric.

16. The device of claim 15 wherein the doped well is configured as a back gate for applying a bias across the second capacitive dielectric.

17. The microcircuit of claim 5, wherein the reference voltage is the electrical ground.

18. The microcircuit of claim 1 wherein the doped substrate includes an N-well and the dual gate capacitive field effect transistor is a p-type device.

19. The microcircuit of claim 1 wherein the doped substrate includes a P-well and the dual gate capacitive field effect transistor is an n-type device.

20. The microcircuit of claim 1, the dual gate capacitive field effect transistor further including a primary gate oxide layer between the buried oxide layer and the primary gate.

* * * * *